(12) United States Patent
Lai

(10) Patent No.: US 6,555,016 B2
(45) Date of Patent: Apr. 29, 2003

(54) METHOD OF MAKING MULTILAYER SUBSTRATE

(75) Inventor: Kuei-Yu Lai, Kaohsiung (TW)

(73) Assignees: Advanced Semiconductor Engineering, Inc. (TW); Ase Material Inc. (TW)

(*) Notice: Subject to any disclaimer, the term of this patent is extended or adjusted under 35 U.S.C. 154(b) by 197 days.

(21) Appl. No.: 09/749,666

(22) Filed: Dec. 28, 2000

(65) Prior Publication Data

US 2002/0084244 A1 Jul. 4, 2002

(51) Int. Cl.[7] .............................................. H01B 13/00
(52) U.S. Cl. ............................. 216/18; 216/19; 216/94; 438/629
(58) Field of Search ................................ 216/17, 18, 19, 216/94; 29/840, 852, 830; 438/629

(56) References Cited

U.S. PATENT DOCUMENTS 5,685,070 A  * 11/1997  Alpaugh et al. ............... 29/840
5,731,047 A     3/1998  Noddin ........................ 427/555
5,847,327 A  * 12/1998  Fisher et al. .................. 174/258

* cited by examiner

*Primary Examiner*—Robert Kunemund
*Assistant Examiner*—Lan Vinh

(57) ABSTRACT

A method of making a multilayer substrate comprising: (a) providing an interlayer circuit board having conductor circuits thereon; (b) forming a dielectric layer on the interlayer circuit board; (c) mechanical drilling (or laser drilling) through the dielectric layer to the conductor circuits at predetermined positions thereof so as to form blind-vias; (d) electrolessly plating a conductive layer on the surface of the dielectric layer and the blind-vias; (e) forming an etch resist on the conductive layer, followed by formation of outer conductor circuits on the conductive layer by selectively etching; and (f) removing the etching resist. Since the blind-vias of the present invention are formed by drilling instead of photosensitive polymer technology, the processing steps are minimized thereby significantly improving the production efficiency. Furthermore, since the mechanical drilling (or laser drilling) has better accuracy, the blind-vias can be formed with better accuracy.

20 Claims, 5 Drawing Sheets

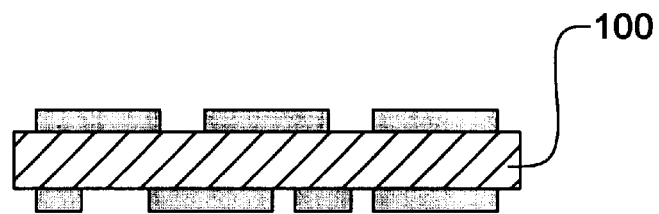
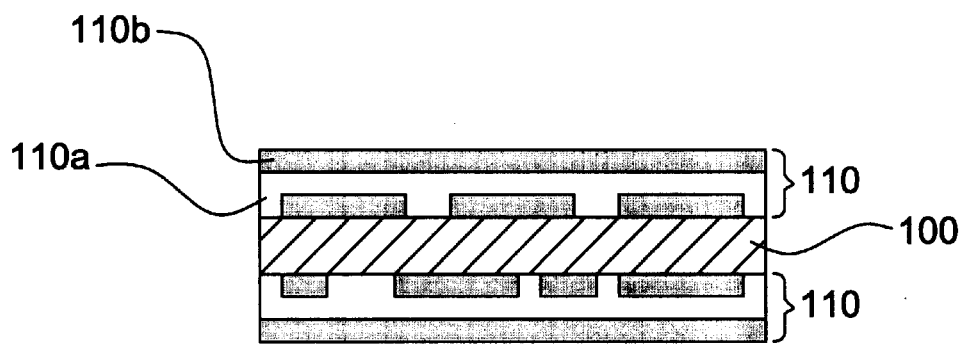
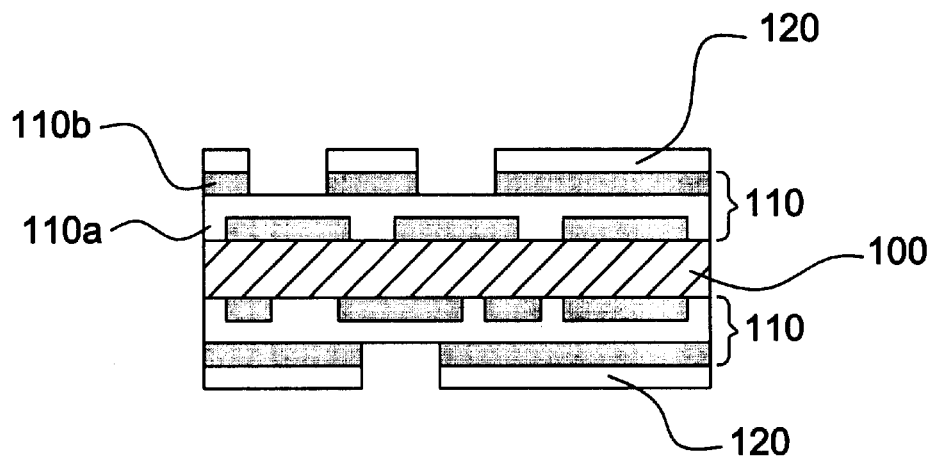

METHOD OF MAKING MULTILAYER SUBSTRATE

BACKGROUND OF THE INVENTION

1. Field of the Invention

This invention relates to a fabrication process of substrate, and more specifically to a method of making multilayer substrate by build-up process.

2. Description of the Related Art

Currently, the methods for use in forming multilayer substrate by build-up process mainly comprise the conformal mask self-limited drilling process and the photo-via process.

FIGS. 1–5 illustrate major steps of fabrication of a multilayer substrate by the conformal mask self-limited drilling process. FIG. 1 shows an interlayer circuit board 100 with two layers of conductor circuits formed thereon. Referring to FIG. 2, two resin coated copper foils 110 are laminated on both sides of the interlayer circuit board 100 by conventional methods such as thermocompression. The resin coated copper foil 110 mainly comprises an insulating resin layer 110a and a copper foil 110b. Referring to FIG. 3, a photoresist layer 120 is formed over the surface of the copper foil 110b laminated on the both sides of the interlayer circuit board 100 using conventional techniques and materials, then imaged and developed. As is well-known, a photomask is used to image only certain area of the photoresist layer 120 which, when developed, are removed to leave predetermined portions of the copper foil 110b exposed. Then the exposed portions of the copper foil 110b are etched so as to form fine holes at predetermined positions thereof. Referring to FIG. 4, the remaining photoresist is removed and laser beams are applied to the insulating resin layer 110a exposed from the fine holes of the copper foil 110b. A plurality of laser pulses are used to remove the exposed resin layer 110a until parts of the conductor circuits of the interlayer circuit board 100 are exposed thereby forming via holes. It is noted that each laser pulse has a energy density per pulse that is greater than the ablation threshold of resin layer 110a and less than the ablation threshold of the copper foil 110b. Subsequently, referring to FIG. 5, a copper layer 130 is plated over the entire surface of the copper foil 110b (including the via holes) for electrically connecting the conductor circuits of the interlayer circuit board 100 to the copper foil 110b. Plating in this step is typically carried out by electroless copper plating. The copper layer 130 establishes electrical connections between the copper foil 110b, the via holes, and the conductor circuits of the interlayer circuit board 100. Finally, an etch resist is formed on the copper layer 130, and then the copper layer 130 is selectively etched to form outer layer circuits (not shown).

FIGS. 6–10 illustrate major steps of fabrication of a multilayer substrate by the photo-via process. As shown in FIG. 6, a photoimagable dielectric (PID) 210 is applied onto the interlayer circuit board 100 by conventional methods. Then, the PID 210 is imaged and developed to form photo vias 210a at predetermined positions thereof (see FIG. 7). After that, a through hole 220 is formed by mechanical drilling or laser drilling (see FIG. 8). Subsequently, referring to FIG. 9, a copper layer 230 is plated over the entire surface of the PID 210 (including the photo vias 210a and through hole 220). Finally, an etch resist is formed on the copper layer 230, and then the copper layer 230 is selectively etched to form outer layer circuits (not shown).

However, the aforementioned build-up methods both use photoimaging and developing techniques to form the blind vias. Due to errors originated in the photoimaging and developing process, it is quite easy to have misregistration problems during via formation.

The present invention therefore seeks to provide a multilayer substrate manufacturing method which overcomes, or at least reduces the above-mentioned problems of the prior art.

SUMMARY OF THE INVENTION

It is a primary object of the present invention to provide a process for producing a multilayer substrate wherein the via holes are directly formed by mechanical drilling or laser drilling instead of photoimaging and developing thereby simplifying the whole process and avoiding the misregistration problems due to errors originated in the photoimaging and developing process.

Accordingly, the present invention provides a method of making a multilayer substrate comprising: (a) providing an interlayer circuit board having conductor circuits thereon; (b) forming a dielectric layer on the interlayer circuit board; (c) mechanical drilling (or laser drilling) through the dielectric layer to the conductor circuits at predetermined positions thereof so as to form via holes; (d) electrolessly plating a conductive layer on the surface of the dielectric layer and the via holes; (e) forming an etch resist on the conductive layer, followed by formation of outer conductor circuits on the conductive layer by selectively etching; and (f) removing the etching resist.

Typically, the mechanical drilling (or laser drilling) has better accuracy, so the via holes are formed with better accuracy. Furthermore, since the via holes are formed by drilling instead of photoimaging and developing, the processing steps of the method in accordance with the present invention are minimized thereby significantly improving the production efficiency.

BRIEF DESCRIPTION OF THE DRAWINGS

Other objects, advantages, and novel features of the invention will become more apparent from the following detailed description when taken in conjunction with the accompanying drawings.

FIGS. 1–5 illustrate in cross-section major steps of fabrication of a multilayer substrate by the conformal mask self-limited drilling process;

DETAILED DESCRIPTION OF THE PREFERRED EMBODIMENT

FIGS. 10–13 illustrate major steps of fabrication of a multilayer substrate in accordance with a preferred embodiment of the present invention.

Figure 10:
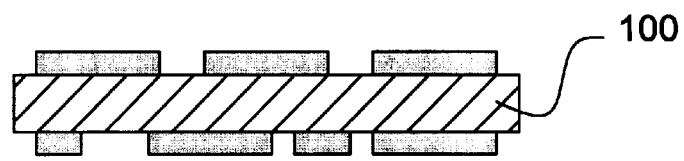
FIGS. 10–13 illustrate in cross-section major steps of fabrication of a multilayer substrate in accordance with a preferred embodiment of the present invention.

FIG. 10 shows an interlayer circuit board 100. Though only two layers of conductor circuits of the interlayer circuit board 100 are shown in this preferred embodiment, an interlayer circuit board for use with the invention can include any number of layers of conductor circuits if desired. It should be understood that the interlayer circuit board 100 may be a multilayer substrate formed by any of a number of build-up technologies. Preferably, the interlayer circuit board 100 is formed from a core layer made of fiberglass reinforced BT (bismaleimide-triazine) resin or FR-4 fiberglass reinforced epoxy resin thereby increasing the mechanical strength of the finished multilayer substrate.

Figure 11:
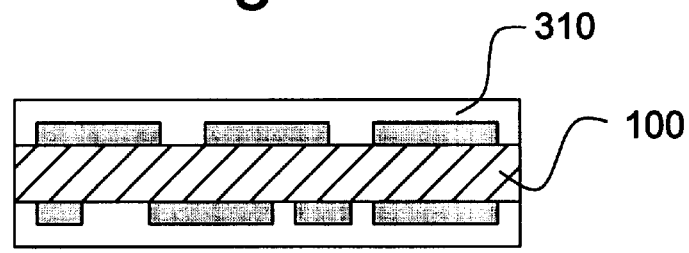
Figure 12:
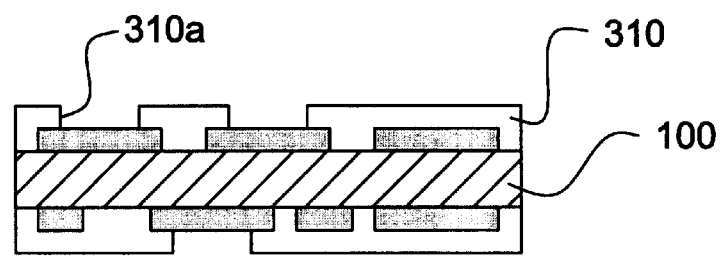

Referring to FIG. 11, a dielectric layer 310 is applied onto the interlayer circuit board 100 by conventional methods such as screen printing, spin coating or spray coating. Preferably, the dielectric layer 310 is made of thermosetting resin.

Figure 4:
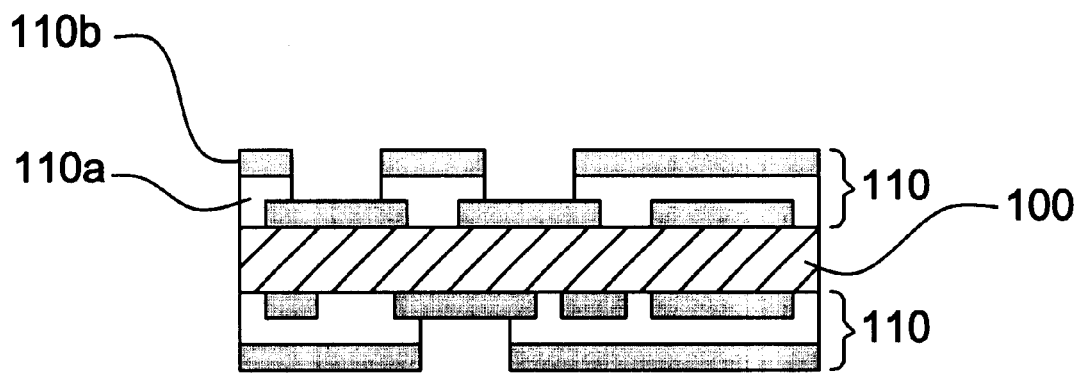
Figure 5:
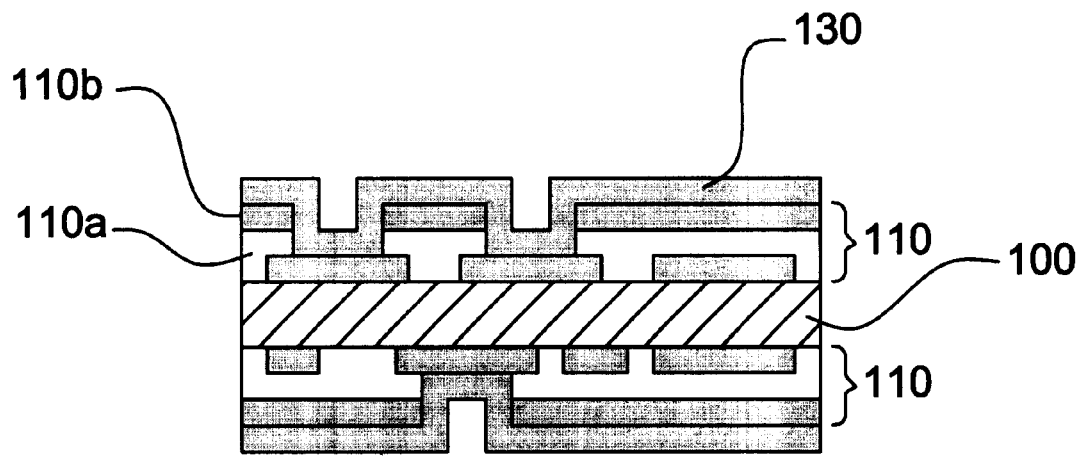
Figure 6:
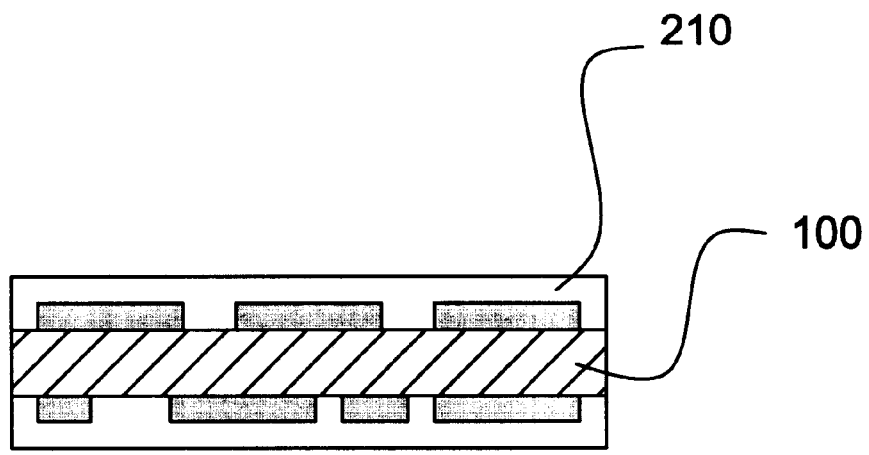
FIGS. 6–9 illustrate in cross-section major steps of fabrication of a multilayer substrate by the photo-via process.
Figure 7:
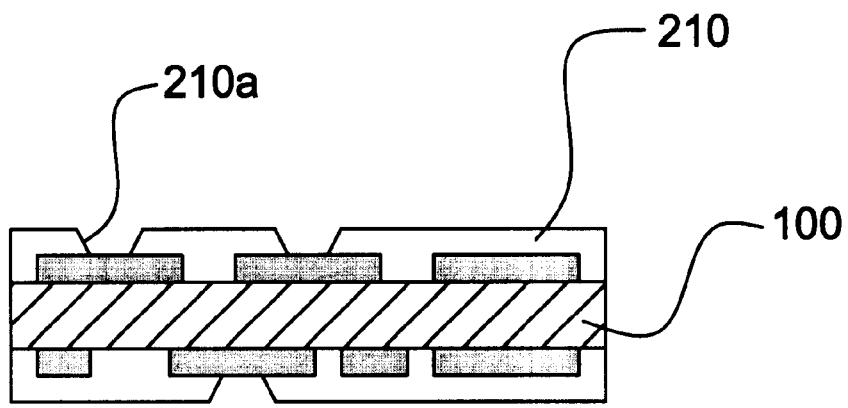
Figure 8:
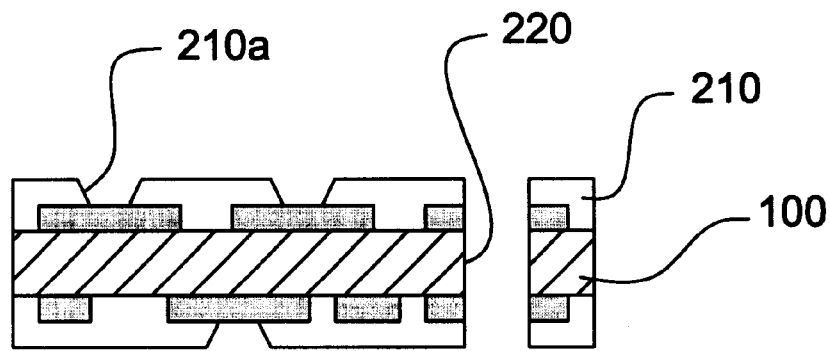
Figure 9:
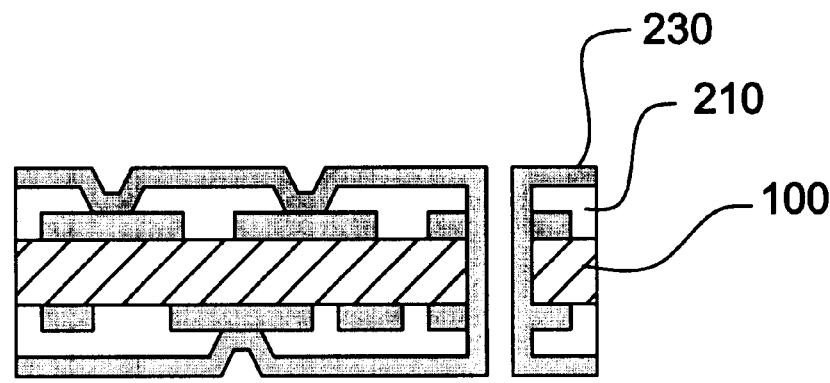

Referring to FIG. 5, via holes 310a are formed by drilling through the dielectric layer 310 to the conductor circuits of the interlayer circuit board 100 at predetermined positions thereof. The drilling step may be accomplished by mechanical drilling or laser drilling wherein laser drilling is preferred in view of high accuracy. It can be understood that laser beam is used to remove the predetermined portions of the dielectric layer 310 until parts of the conductor circuits of the interlayer circuit board 100 are exposed thereby forming blindvias. Subsequently, if necessary, through-holes (not shown) may be formed by means of mechanical drilling or laser drilling simultaneously. The types of laser usable in the drilling step include carbon dioxide laser, YAG (yttrium aluminum garnet) laser, excimer laser, etc., of which carbon dioxide laser is preferred in view of productivity. It should be understood that the overall thickness of the dielectric layer must be controlled. If the dielectric layer is too thick, it is difficult to apply sufficient laser energy to ablate a via in the dielectric in a reasonable period of time, and to avoid ablating all the way through the metal conductor underneath the via. To achieve a reasonable production rate using a thermosetting resin dielectric, the overall thickness of the dielectric layer should be less than 3 mils, preferably less than 2 mils. Furthermore, the minimum dielectric thickness must be sufficient to establish electrical isolation between different conductor circuit layers.

Figure 13:
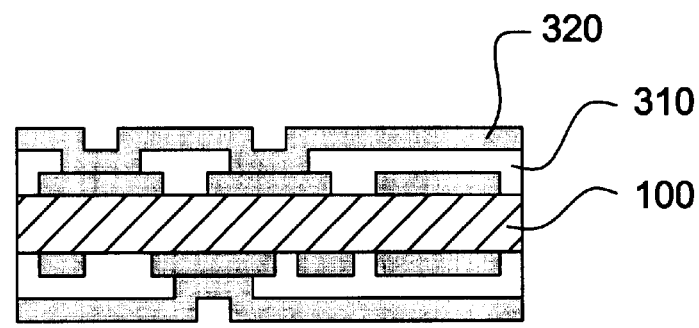

Referring to FIG. 13, a metal layer such as a copper layer 320 is plated over the surface of the dielectric layer 310 and the blind-vias 310a. Plating in, this step is carried out by using the same technique as usually employed for through-hole plating of the circuit boards, e.g., electroless copper plating. Specifically, a material which becomes the nucleus of plating, such as palladium, is deposited on the surface of the dielectric layer 310 and the via holes 310a which, in turn, is contacted with an electroless copper bath so that the plating metal will be deposited over the dielectric surface and the entire via hole walls coated with the nucleus material. This plating, i.e., the copper layer 320 establishes electrical connections of the conductor circuits of the interlayer circuit board 100 and the via holes 310a.

After that, an etch resist such as a photosensitive dry film (not shown) is formed on each surface of outer copper layer 320 using a hot-roll laminator, and then the copper layer 320 is selectively etched to form outer layer circuits (not shown). After removal of the etch resist, a four-layered multilayer substrate is was obtained.

Since the mechanical drilling (or laser drilling) has better accuracy, the via holes are formed with better accuracy. Therefore, the substrate manufacturing method of the present invention significantly reduces the misregistration problems occurred in the prior arts due to errors originated in the photoimaging and developing process. And since the via holes of the present invention are formed by drilling instead of photoimaging and developing, the processing steps are minimized thereby significantly improving the production efficiency. Furthermore, laser drilling or mechanical drilling are more environmental friendly than photosensitive polymer technology in that no organic chemicals or solutions are involved for via hole formation.

Although the invention has been explained in relation to its preferred embodiment, it is to be understood that many other possible modifications and variations can be made without departing from the spirit and scope of the invention as hereinafter claimed.

What is claimed is:

1. A method of making a multilayer substrate, said method comprising the steps of:

providing an interlayer circuit board having conductor circuits thereon;

forming a dielectric layer on the interlayer circuit board;

right after the dielectric layer forming step, drilling through the dielectric layer to the conductor circuits so as to form via holes, wherein only the dielectric layer is drilled in the drilling step;

electrolessly plating a conductive layer on surfaces of the dielectric layer and the via holes;

forming an etching resist on the conductive layer, followed by formation of outer conductor circuits on the conductive layer by selectively etching; and removing the etching resist.

2. The method as claimed in claim 1, wherein the interlayer circuit board has opposing upper and lower surfaces and has a layer of said conductor circuits formed on one of said surfaces.

3. The method as claimed in claim 1, wherein the interlayer circuit board has opposing upper and lower surfaces and has two layers of said conductor circuits respectively formed on both said surfaces.

4. The method as claimed in claim 1, wherein the drilling is accomplished by mechanical drilling.

5. The method as claimed in claim 1, wherein the drilling is accomplished by laser drilling.

6. The method as claimed in claim 1, wherein the dielectric layer is made of thermosetting resin.

7. The method as claimed in claim 1, wherein the interlayer circuit board is formed from fiberglass reinforced BT (bismaleimide-triazine) resin.

8. The method as claimed in claim 1, wherein the interlayer circuit board is formed from FR-4 fiberglass reinforced epoxy resin.

9. A method of making a multilayer substrate, said method comprising the steps of:

providing an interlayer circuit board having conductor circuits thereon;

forming a dielectric layer on top the conductor circuits;

drilling through the dielectric layer until the conductor circuits are exposed so as to form via holes, wherein a top surface of the dielectric layer is exposed when said drilling begins;

electrolessly plating a conductive layer on top the dielectric layer and in the via holes;

forming an etching resist on the conductive layer;

subsequent to the step of forming the etching resist, selectively etching the conductive layer to form outer conductor circuits; and removing the etching resist.

10. The method of claim 9, wherein said drilling is conducted without affecting the conductor circuits.

11. The method of claim 9, wherein only the dielectric layer is drilled during said drilling.

12. The method of claim 9, wherein the dielectric is formed to be in direct physical contact with the conductor circuits.

13. The method of claim 9, wherein an entirety of the top surface of the dielectric layer is exposed during said drilling.

14. The method as claimed in claim 9, wherein the interlayer circuit board has opposing upper and lower surfaces and has a layer of said conductor circuits formed on one of said surfaces.

15. The method as claimed in claim 9, wherein the interlayer circuit board has opposing upper and lower surfaces and has two layers of said conductor circuits respectively formed on both said surfaces.

16. The method as claimed in claim 9, wherein the drilling is accomplished by mechanical drilling.

17. The method as claimed in claim 9, wherein the drilling is accomplished by laser drilling.

18. The method as claimed in claim 9, wherein the dielectric layer is made of thermosetting resin.

19. The method as claimed in claim 9, wherein the interlayer circuit board is formed from fiberglass reinforced BT (bismaleimide-tirazine) resin.

20. The method as claimed in claim 9, wherein the interlayer circuit board is formed from FR-4 fiberglass reinforced epoxy resin.

* * * * *